United States Patent
Polak et al.

(10) Patent No.: US 8,933,972 B2
(45) Date of Patent: Jan. 13, 2015

(54) LUMINANCE ADJUSTMENT IN A DISPLAY UNIT

(75) Inventors: Robert D. Polak, Lindenhurst, IL (US); Zhiming (Jim) Zhuang, Kildeer, IL (US)

(73) Assignee: Google Technology Holdings LLC, Mountain View, CA (US)

( * ) Notice: Subject to any disclaimer, the term of this patent is extended or adjusted under 35 U.S.C. 154(b) by 1183 days.

(21) Appl. No.: 11/670,194

(22) Filed: Feb. 1, 2007

(65) Prior Publication Data
US 2008/0186322 A1 Aug. 7, 2008

(51) Int. Cl.
*G09G 5/10* (2006.01)

(52) U.S. Cl.
USPC .............................. 345/690; 345/589; 345/88

(58) Field of Classification Search
USPC ............ 345/690, 55, 63, 76–77, 88–89, 102, 345/589; 348/649, 223.1
See application file for complete search history.

(56) References Cited

U.S. PATENT DOCUMENTS

| | | | | |
|---|---|---|---|---|
| 5,929,843 | A | * | 7/1999 | Tanioka ........................ 345/600 |
| 6,034,665 | A | * | 3/2000 | Kim .............................. 345/593 |
| 6,453,067 | B1 | * | 9/2002 | Morgan et al. ................ 382/162 |
| 6,950,115 | B2 | | 9/2005 | Brown Elliott |
| 6,980,219 | B2 | | 12/2005 | Higgins |
| 7,123,277 | B2 | | 10/2006 | Brown Elliott et al. |
| 7,151,517 | B2 | * | 12/2006 | Lee ................................. 345/88 |
| 7,184,067 | B2 | * | 2/2007 | Miller et al. ................... 345/696 |
| 7,230,594 | B2 | * | 6/2007 | Miller et al. ..................... 345/82 |
| 7,277,075 | B1 | * | 10/2007 | Hirano et al. .................... 345/89 |
| 7,567,255 | B2 | * | 7/2009 | Ikeda ............................. 345/590 |
| 7,586,497 | B2 | * | 9/2009 | Boroson et al. ............... 345/590 |
| 7,592,996 | B2 | * | 9/2009 | Brown Elliott et al. ....... 345/102 |
| 7,656,375 | B2 | * | 2/2010 | Lo et al. ......................... 345/88 |
| 7,986,291 | B2 | * | 7/2011 | Van Mourik et al. ........... 345/88 |
| 8,035,655 | B2 | * | 10/2011 | Kim et al. ..................... 345/604 |
| 2003/0151694 | A1 | * | 8/2003 | Lee et al. ...................... 348/687 |
| 2004/0178743 | A1 | | 9/2004 | Miller et al. |
| 2006/0146351 | A1 | * | 7/2006 | Lo et al. ........................ 358/1.9 |
| 2006/0244686 | A1 | | 11/2006 | Higgins |
| 2006/0274212 | A1 | | 12/2006 | Lo |

FOREIGN PATENT DOCUMENTS

EP 1679678 A 7/2006
WO WO 2005/040908 A1 5/2005

OTHER PUBLICATIONS

PCT/US2008/052192; PCT International Search Report and Written Opinion, mailed May 28, 2008 (11 pages).
PCT/US2008/052192; PCT International Preliminary Report on Patentability, issued on Aug. 4, 2009 (6 pages).
European Patent Application No. 08728387.5, Office Action, issued on Dec. 22, 2009 (2 pages).

(Continued)

*Primary Examiner* — Jason Mandeville
(74) *Attorney, Agent, or Firm* — Blakely Sokoloff Taylor & Zafman LLP (57) ABSTRACT

A method and system for adjusting luminance in a display device including displaying an image with saturated colors, and adjusting luminance settings of sub-pixels so that a relative luminance ratio between full white color and any fully saturated color is within approximately 25 percent of a reference relative luminance ratio between the full white color and the same fully saturated color in an equivalent display device including red, green and blue sub-pixels.

15 Claims, 5 Drawing Sheets

(56) References Cited

OTHER PUBLICATIONS

European Patent Application No. 08728387.5, Office Action, issued on Aug. 18, 2010 (5 pages).
European Patent Application No. 08728387.5, Summons to attend Oral proceedings, issued on Jan. 18, 2013 (9 pages).
European Patent Application No. 08728387.5, Oral proceeding minutes, issued on Jun. 25, 2013 (54 pages).
Chinese Patent Application No. 200880003660.8, First Office Action, issued on May 31, 2011 (10 pages).
Chinese Patent Application No. 200880003660.8, Second Office Action, issued on Aug. 23, 2012 (9 pages).
Chinese Patent Application No. 200880003660.8, Third Office Action, issued on May 2, 2013 (6 pages).
Korean Patent Application No. Oct. 2009-7016145, Notice of Preliminary Rejection, issued on Feb. 1, 2011 (4 pages).
Korean Patent Application No. Oct. 2009-7016145, Notice of Final Rejection, issued on Oct. 25, 2011 (4 pages).
Indian Patent Application No. 2566/KOLNP/2009, First Examination Report issued Jun. 30, 2014, 2 pages.

* cited by examiner

NON-LINEAR LIGHT INTENSITY

LUMINANCE ADJUSTMENT IN A DISPLAY UNIT

FIELD OF THE DISCLOSURE

The present disclosure relates generally to display devices and more specifically to methods and systems for adjusting luminance of display devices.

BACKGROUND

A display device provides a visual representation of images including text, which are acquired, stored or transmitted in various forms. Examples of display devices include, but are not limited, to computer displays, video monitors, oscilloscopes, television displays, and display panels on portable electronic devices. Display devices generally comprise a screen including an array of pixels and associated circuitry for rendering the images on the screen. Each pixel may include multiple sub-pixels, for example, red (R), green (G), and blue (B) sub-pixels, one or more of which may be shared by or among neighboring pixels. A display having R, G and B pixels is known as an RGB display.

The sub-pixels render display characteristics and features such as color, luminance, saturation, hue, brightness and other image properties of a display device. Display brightness varies with the ambient environment in which the display device is viewed. In order to display a clear image, the brightness of the displayed image must be greater than the ambient light. Display brightness may be increased by increasing power applied to the display. Display brightness may also be increased by adding a white sub-pixel to each pixel.

In an RGB display, white color is generated when all primary (RGB) color settings are at a maximum value. For example, the RGB display in an 8 bit color setting will display white color when all three primary color sub-pixels are set at a maximum value (e.g., 255 in an 8 bit setting). A display device with pixels having a white sub-pixel in addition to R, G and B sub-pixels is known as a RGBW display. The addition of the white sub-pixel increases the brightness of images with non-saturated colors. Images with fully or nearly fully saturated colors will be affected by the presence of the white sub-pixel. Areas of images with saturated colors will appear dark (or dull) since white sub-pixels cannot enhance brightness of saturated colors.

A saturated color is a color wherein one or two of the primary color setting approximates to zero. For example, in a RGB display, if only the red (R) sub-pixel has non-zero brightness, the pixel is said display saturated red color. It should be appreciated that images with non-saturated colors are statistically more common than images with saturated colors. However, the graphical user interface or displays of many portable products, such as cellular phones, commonly uses fully or nearly fully saturated colors. The addition of a white sub-pixel will generally reduce power consumption and increase the overall display brightness. However, the issue of perceived darker (or dull) saturated color needs to be addressed to better present a full spectrum of images in the presence of white sub-pixels.

Another method includes control of color information of the sub-pixels. The color information of the sub-pixels is altered to achieve a better luminance by adjusting color saturation of the sub-pixels. Alteration in the color information however changes the original colors of the image. It is generally desirable to maintain the intended color and luminance balance of an image in display devices with white sub-pixel configuration.

BRIEF DESCRIPTION OF THE DRAWINGS

The accompanying figures, where like reference numerals refer to identical or functionally similar elements throughout the separate views, and which, together with the detailed description below, are incorporated in and form part of the specification, serve to further illustrate various embodiments and explain various principles and advantages of the disclosure.

DETAILED DESCRIPTION

Various embodiments of the present disclosure pertain to adjusting luminance of a RGBW display device including a plurality of pixels, wherein each pixel includes at least two sub-pixels. In one embodiment, an image having saturated colors is displayed. The luminance settings of the sub-pixels are adjusted so that a relative luminance ratio between full white color and any fully saturated color is approximately 25 percent of a reference relative luminance ratio between the full white color and the same fully saturated color in an equivalent RGB display device.

Another embodiment includes a RGBW display device comprising a plurality of pixels, wherein each pixel includes at least two sub-pixels. The display device produces images having saturated colors. The display device also includes a display controller having a controller output coupled to the plurality of pixels, wherein the display controller is configured to adjust luminance settings of the sub-pixels. The luminance settings of the sub-pixels are adjusted so that a relative luminance ratio between full white color and any fully saturated color is within 25 percent of a reference relative luminance ratio between the full white color and the same fully saturated color in an equivalent RGB display device.

Before describing in detail the particular method and systems for adjusting luminance settings in accordance with various embodiments, it should be observed that the disclosure resides primarily in combinations of method steps and apparatus components related to adjusting the luminance settings of the display devices. Accordingly, the apparatus components and method steps have been represented where appropriate by conventional symbols in the drawings, showing only those specific details that are pertinent to understanding the disclosure so as not to obscure the disclosure with details that will be readily apparent to those of ordinary skill in the art having the benefit of the description herein.

Figure 1:
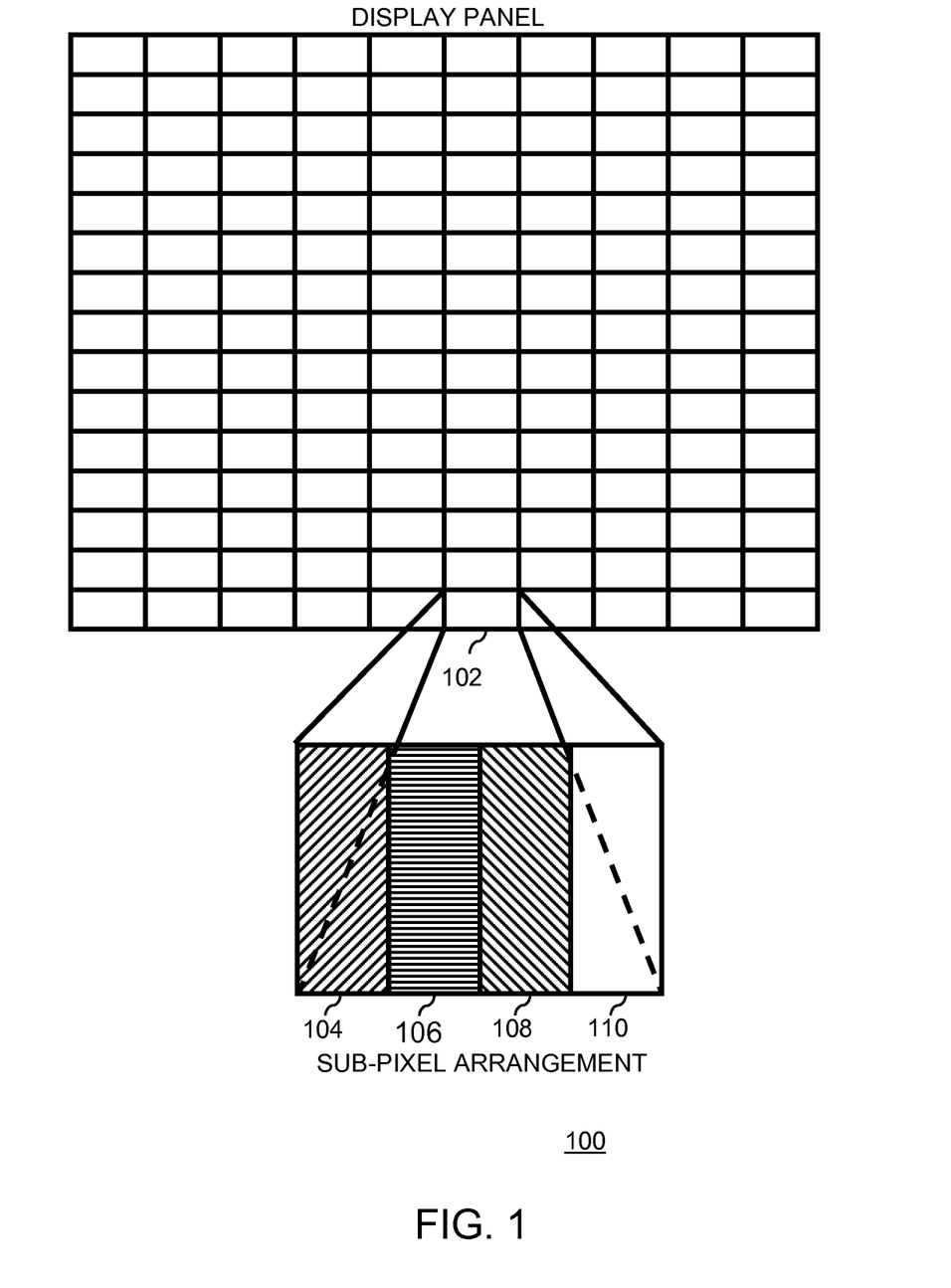
FIG. 1 illustrates a pixel grid.

FIG. 1 illustrates a pixel grid 100 comprising a plurality of pixels. The pixel grid corresponds to a display panel/screen of a display device. Examples of the display device include computer displays, video monitors, oscilloscopes, television displays, mobile-phone display panels, and the like. Examples of the display panel/screen of the display devices may include Liquid Crystal Display (LCD) displays, Light Emitting Diode (LED) displays, Organic Light Emitting Diode (OLED) displays, plasma displays, Cathode Ray Tube (CRT) displays, Field Emission Display (FED) devices and the like.

A pixel may be considered as a smallest addressable imaging element or display point. Multiple pixels of the plurality of pixels combine together to make up an image. Further, each pixel of the plurality of pixels in the pixel grid 100 includes at least two sub-pixels. These sub-pixels can be of various color combinations. For the purpose of this description, the pixel grid 100 is shown to have four sub-pixels. Each pixel includes three sub-pixels displaying three primary colors and a white sub-pixel. In other words, each pixel of the pixel grid 100 includes a red (R) sub-pixel, a green (G) sub-pixel, a blue (B) sub-pixel and a white (W) sub-pixel to form a RGBW display. For instance, a pixel 102 of the pixel grid 100 includes a red sub-pixel 104, a green sub-pixel 106, a blue sub-pixel 108, and a white sub-pixel 110. However, a display having only three primary color sub-pixels such as RGB pixels is known as an RGB display.

The sub-pixels can be arranged in numerous sequences and geometric shapes such as rectangular, hexagonal, triangular, stripes, diagonal, and the like. The sub-pixels render display features such as luminance, color saturation, hue, brightness, and the like, to the visual representation of an image displayed through the display device. Various combinations and settings of these display features for each sub-pixel can be controlled to generate images of different display quality. A variation in the display settings and features such as luminance and color saturation of the sub-pixels can be altered to obtain a desired display quality of the visual representation of the images and text through the pixel grid. Luminance is defined as the amount of light emitted from or passing through a surface. Therefore, luminance may be considered as how bright a surface will appear. Luminance of one sub-pixel is affected by the luminance of the other sub-pixels. For example, the luminance of the red sub-pixel 104 in the pixel 102 can be affected by the presence or absence of the white sub-pixel 110. For instance, in the presence of the white sub-pixel, the red sub-pixel displaying fully saturated red color may appear darker or dull.

A RGB display includes only three primary color sub-pixels, for example, the red sub-pixel, the green sub-pixel and the blue sub-pixel. In a RGB display or RGBW display, a pixel is said to display a saturated color when luminance of one or two of the three primary color sub-pixels is substantially close to zero. For example, a pixel is said to display a saturated red color when luminance of the green sub-pixel and the blue sub-pixel is less than 25 percent of their maximum value.

In one embodiment, if one or two sub-pixels are set to maximum luminance (255 in 8 bit settings) and the luminance of the other sub-pixels approximates to zero, the pixel is said to display fully saturated color. A fully saturated color is color produced by a pixel in which at least one primary color setting is less than approximately 25 percent of its maximum value while all other primary color settings for the pixel are at more than 75 percent of their maximum value. To display a full white color all three primary colors in the RGB sub-pixel display are set to maximum luminance (255 in 8 bit settings).

Figure 2:
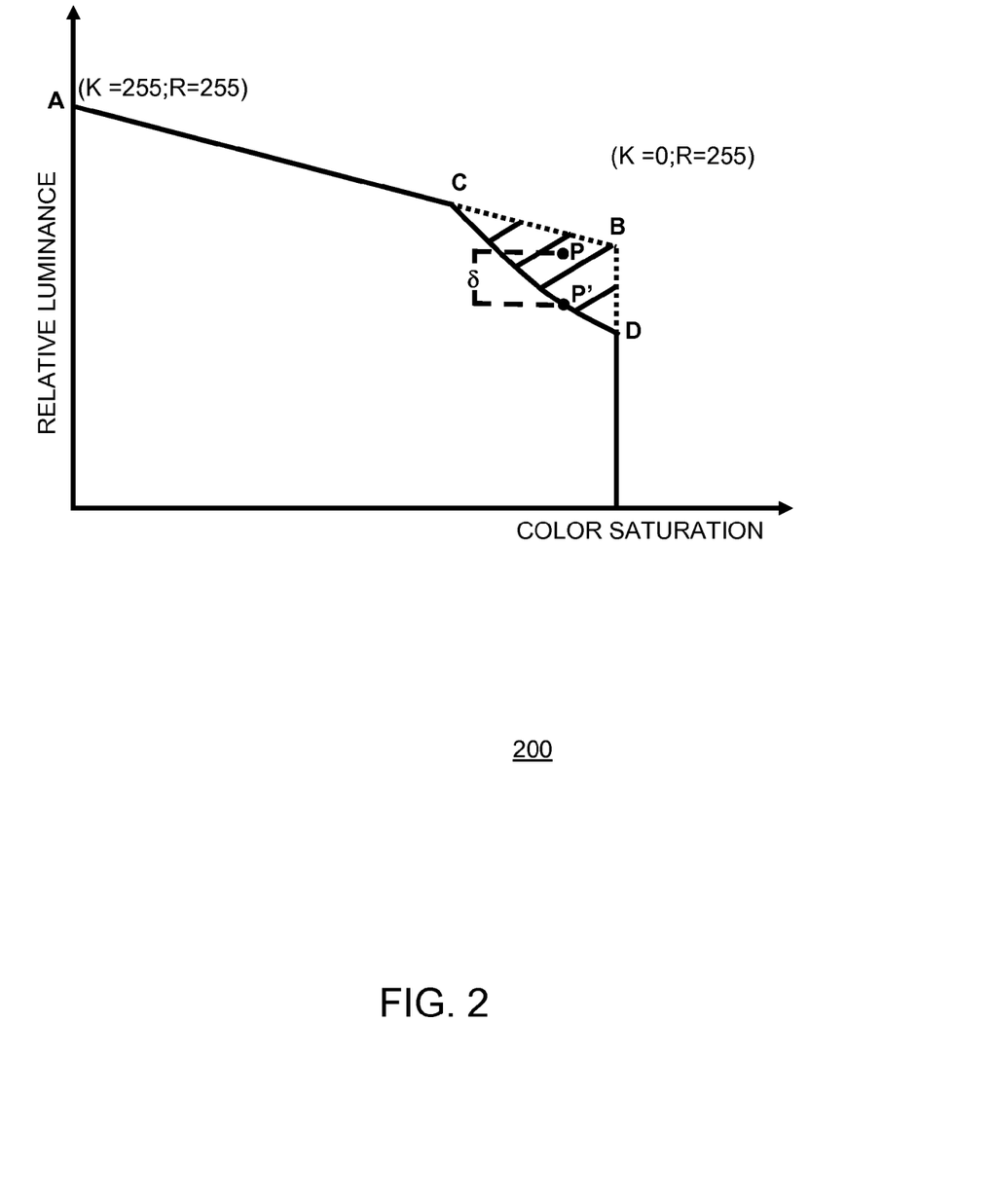
FIG. 2 illustrates a graphical relation between relative luminance and color saturation of a pixel.

FIG. 2 illustrates a graphical relation 200 between relative luminance and color saturation of a pixel. The graphical relation is traced with relative luminance (L) along the vertical axis (Y-axis) and color saturation on the horizontal axis (X-axis).

Each pixel of a pixel grid, for example, the pixel grid 100 in FIG. 1, receives data about specified display settings and features assigned to each sub-pixel of the pixel. In a RGBW display, the data received by the pixel includes individual values of color saturation, hue and luminance information for R, B, G and W sub-pixels. A given set of data for the sub-pixels of the pixel will yield a unique set of color saturation and relative luminance ratio (L) of the pixel. Color saturation of a particular color can be a measure of its purity and percentage of intensity. The relative luminance ratio (L) can be overall transmittance of the pixel. The relative luminance is a ratio of the luminance (Lw) of a pixel displaying full white color and the luminance (Lf) of a pixel displaying a luminance spectrum of fully saturated color. In other words, Lw is the luminance of the pixel when the color settings for all the three primary sub-pixels of the pixel are set to maximum, i.e., R, G and B sub-pixels have a color setting of 255 in an 8 bit system, and Lf is the luminance of the pixel that has one or two of the three primary color settings of the sub-pixels at zero while the rest of the primary color settings for the sub-pixels of the pixel are at their maximum value. The relative luminance ratio (L) is the measure of luminance of a pixel as compared to a pixel displaying full white color.

$$\text{Relative Luminance ratio } (L): \quad L = \frac{Lf}{Lw} \qquad \text{Eq (1)}$$

The graphical relation 200 includes a curve A-B traced between the relative luminance ratio and the color saturation of a primary color. The curve A-B describes a boundary for various combinations of the relative luminance ratio and color saturation for a pixel. The curve A-B is traced for a RGB display with 8 bit color settings. For the RGB display, color settings of two primary color sub-pixels is fixed to match a constant value (G=B=constant (K), and color settings for the green sub-pixel and the blue sub-pixel are fixed). Consequently, there are 256 raised to a power of 2 ($256^2$) combinations of relative luminance ratio and color saturation that can occupy the area under a curve A-B. The area under the curve A-B includes a set of values of relative luminance ratio (L) and color saturation, for a primary color, for example, red (R). For a RGBW display, due to the addition of the white sub-pixel in the pixel, the curve A-B for RGB display deviates at point "C" and follows a new curve A-C-D pertaining to the RGBW display. Consequently, there will be a set of pixels, which are displaying saturated colors or colors close to saturation, filling the area C-D-B, sliced off due to deviation. This set of pixels can not be displayed due to the addition of white sub-pixels, for example, white sub-pixels 110 in FIG. 1. Therefore, addition of the white sub-pixel can cause other pixels in the display to appear dull or to appear darker.

In order to aid better understanding the disclosure, consider a scenario, where a display point P(x, y) under the curve A-B and in the area C-DB cannot be displayed due to a deviation in the curve A-B. To display the display point P(x, y) and maintain a color balance, display properties such as luminance of sub-pixels can be adjusted so that the relative luminance ratio of the pixel displaying the display point is within 25 percent of a reference relative luminance ratio. The reference relative luminance ratio is a ratio between the luminance (Lwr) of the full white color and the luminance of luminance (Lfr) of the pixel displaying luminance spectrum of the same fully saturated colors in a RGB display. The reference relative luminance ratio is based on a difference generated in the relative luminance of the pixel displaying the display point P (x, y). The difference is generated due to the deviation in the curve A-B. Due to the presence of the white sub-pixel and the deviation in the curve A-B, there is a change in the y-coordinate of the display point P(x, y). Therefore, to display the display point P(x, y), the y-coordinate of the display point P(x, y) is changed to y'. To apply this change and to maintain a color balance, luminance of the white sub-pixel (for example white sub-pixels 110 shown in FIG. 1) in the RGBW display is reduced based on the change in the y-coordinate of the display point P(x, y). In an illustrative example, luminance of any combination of sub-pixels can be adjusted to apply the change and maintain the color balance. In another illustrative example, the output power of the display device is adjusted to maintain the color balance.

To determine the change to be made in the luminance of a white sub-pixel in the RGBW display, a maximized value of difference in y coordinates is determined. For instance, reduction in the luminance of the white sub-pixel to display the display point P(x,y) is: max ($\delta$/L), where $\delta$ is the change in the relative luminance ratio (y-coordinate) of the display point P. Thus, $\delta$ is defined by $\delta = y - y'$, where y and y' are Y-axis coordinates of display points P(x, y) and P'(x, y'), respectively. L is the relative luminance ratio of the display point P(x, y).

To display P(x, y), the y-axis coordinate for display point P(x, y) should be reduced to such that P(x, y) changes to P'(x, y') and to maintain the color balance, luminance of the white sub-pixel in the RGBW display is reduced by the factor ($\delta$/L).

However, this will lower overall brightness of the display device. Thus, to maintain the overall brightness of the display device, backlight brightness can be increased by a factor L/$\delta$, as described further below with reference to FIG. 3.

Figure 3:
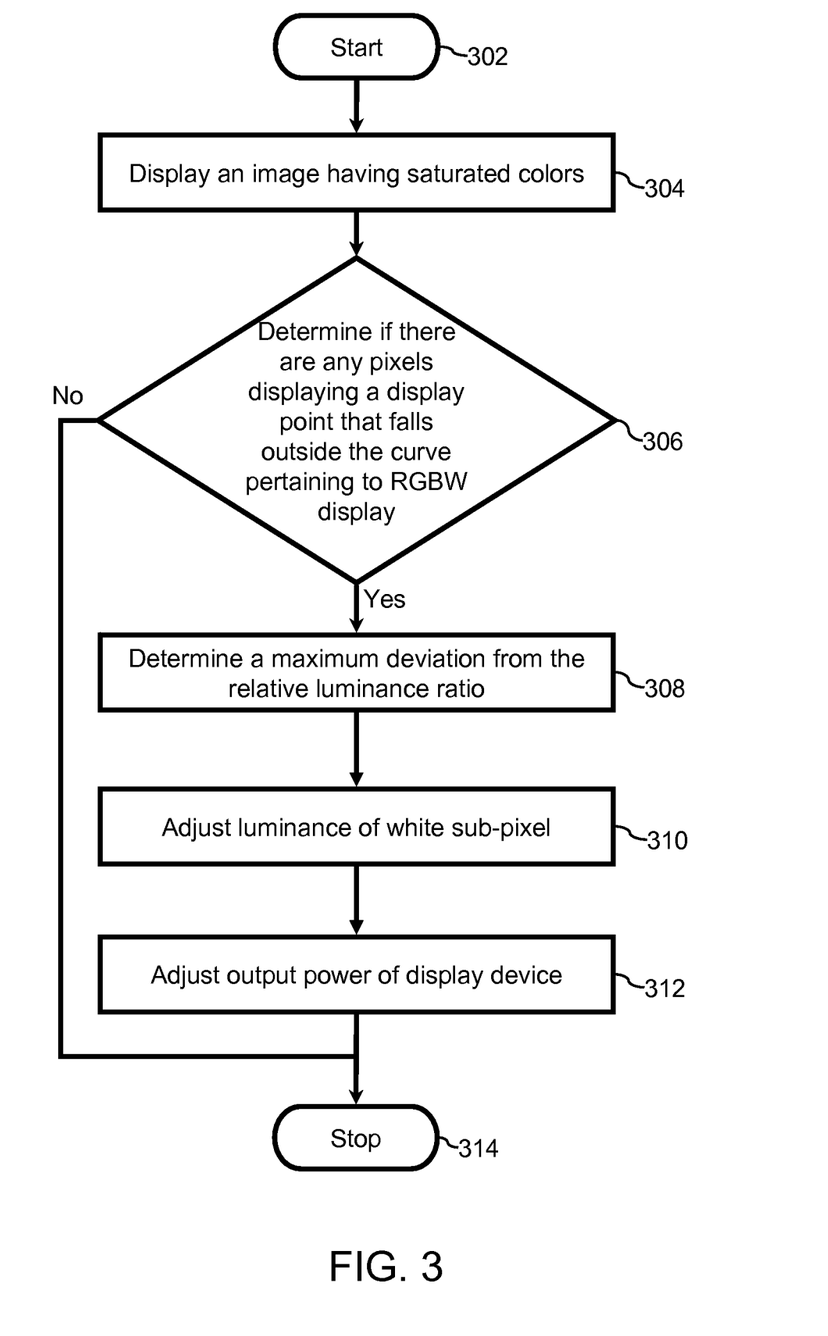
FIG. 3 illustrates a flowchart for adjusting luminance.

FIG. 3 illustrates a flowchart for adjusting luminance of a display device. At step 302, the method is initiated. At step 304 an image having saturated colors is displayed. The image having saturated colors is displayed with the aid of pixels in which one or two of the three primary color settings are approximately close to zero. At step 306, it is determined if there are any pixels with a display point that falls outside the curve A-C-D traced between relative luminance ratio and color saturation pertaining to RGBW display. For example, a display point P(x, y) falling under the curve A-B is displayed in the RGB display. Due to the addition of a white sub-pixel, for example, the white sub-pixel 110, there is a deviation at point "C" in the curve A-B traced between the relative luminance ratio and the color saturation. At point "C" the curve A-B deviates and a new curve A-C-D is traced between the relative luminance ratio and the color saturation pertaining to the RGBW display. Due to the deviation in the curve, the display point P(x, y) falls outside the new curve A-C-D and is not displayed in the RGBW display. Such display points that fill up the area C-B-D (as shown in FIG. 2) are determined at step 306. However, if it is determined that there are no pixels with display points falling outside the new curve A-C-D, the process is terminated.

In FIG. 3 at step 308, a maximum deviation in the relative luminance ratio is determined as max ($\delta$/L) if it is determined at step 306 that there are pixels with display points falling outside the new curve A-C-D. The maximum deviation is the measure of deviation in the relative luminance ratio of the display point from the new curve A-C-D. The maximum deviation is the ratio of the amount of change in the relative luminance ratio due to the addition of a white sub-pixel and the relative luminance of the display point falling in the area C-B-D as described with reference to FIG. 2.

In FIG. 3 at step 310, luminance of white sub-pixels is adjusted so that the relative luminance ratio of the pixel is between 25 percent of the reference relative luminance ratio. Change in the luminance of the white sub-pixel is based on the factor $\delta$/L. To represent the display points falling outside the new curve A-C-D, luminance of the white sub-pixels in the pixel grid, for example, the pixel grid 100 in FIG. 1, is reduced by the factor $\delta$/L. The factor $\delta$/L is the maximum deviation for the display point falling outside the new curve A-C-D.

At step 312, the output power of the display panel/screen of the display device is adjusted to maintain the color balance. In general, to display an image on the display panel/screen, the brightness of the display panel/screen must be more than the ambient diffuse light. The brightness of the display panel/screen can be altered by adjusting the output power of the display device. The output power is adjusted so that the luminance of the full white color is within 25 percent of luminance of the full white color before adjusting the luminance setting of the white sub-pixel or any combination of sub-pixels. The output power can be adjusted by adjusting the input current of an emissive display device. Examples of emissive display devices include, but are not limited to, a Light Emitting Diode (LED) display, an Organic Light Emitting Diode (OLED) display, a plasma display, a Cathode Ray Tube (CRT) display, a Field Emission Display (FED) and the like.

The output power can also be adjusted by adjusting the backlight brightness of the display panel/screen, for example, a Liquid Crystal Display (LCD). The backlight may include a number of light sources providing light to the display panel/screen of the display device. Reduction in the luminance of the white sub-pixel at step 310 leads to a decrease in the brightness of the image displayed. Therefore, to void the decrease in brightness, the backlight brightness is increased by a factor L/$\delta$. Thereafter, the method terminates at step 314.

In one embodiment, adjusting the luminance of the display device includes adjusting gamma settings of the display device. Gamma settings are adjusted so that the relative luminance ratio between the white color and any grey color in a RGBW display is within approximately 50 percent of the relative luminance ratio between the white color and any grey color in the RGB display before adjusting the luminance settings of the sub-pixels. Adjustment in the gamma settings includes correcting the intensity of light produced by the display device. Gamma correction is further described in conjunction with FIG. 4 and FIG. 5.

Figure 4:
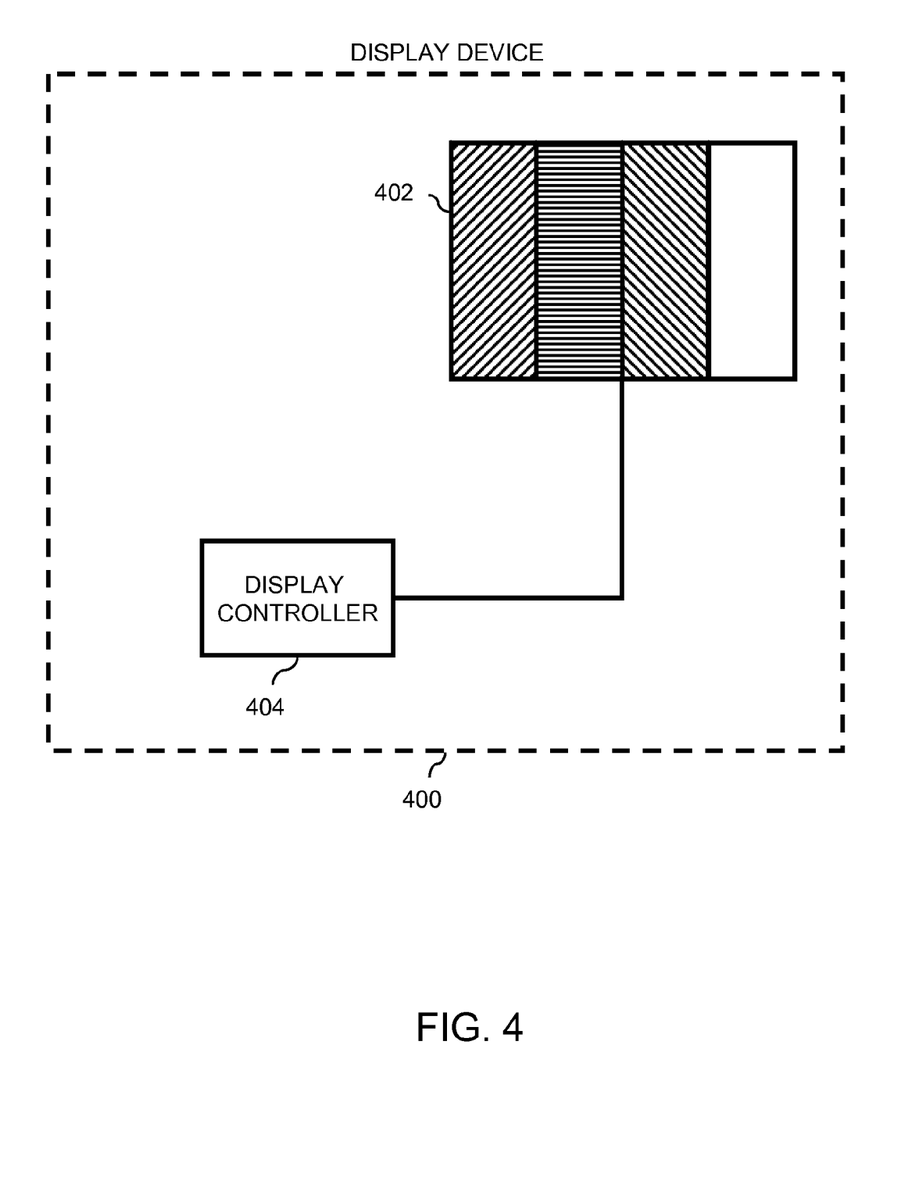
FIG. 4 illustrates a block diagram of a system for adjusting luminance.

FIG. 4 illustrates a block diagram of a system 400 for adjusting the luminance of a pixel. The system 400 includes a plurality of pixels 402, and a display controller 404. The plurality of pixels can correspond to a display panel/screen. Each pixel of the plurality of pixels 402 includes R, G, B and W sub-pixels. The plurality of pixels 402 produces an image having saturated colors on the display device. The display controller 404 has a controller output coupled to the plurality of pixels 402. The display controller is configured to control the display features of the sub-pixels of the plurality of pixels. The display controller is also configured to adjust luminance of the sub-pixels of the plurality of pixels so that a relative luminance ratio between full white color and any fully saturated color in a RGBW display is within approximately 25 percent of a reference relative luminance ratio between full white color and the same fully saturated color in an equivalent display device including only red, green and blue sub-pixels (RGB display). In addition, the display controller is capable of determining a maximum deviation from the reference relative luminance. In one embodiment, the display controller retrieves values of a reference relative luminance ratio from a memory unit (not shown). Examples of the memory unit may include a database, a lookup table, a color palette, and the like. The display controller is configured to compare the relative luminance ratio with the reference relative luminance ratio to determine a deviation in the luminance.

Further, in FIG. 4, the display controller is configured to adjust luminance settings of white sub-pixels so that the deviation in the relative luminance ratio is within the 25 percent of the reference relative luminance ratio. The display controller is also configured to adjust the luminance of any combination of sub-pixels. In addition, the display controller can adjust output power of the display device by adjusting intensity of a backlight. This ensures a uniform spread of light through the plurality of pixels for a better display.

Figure 5:
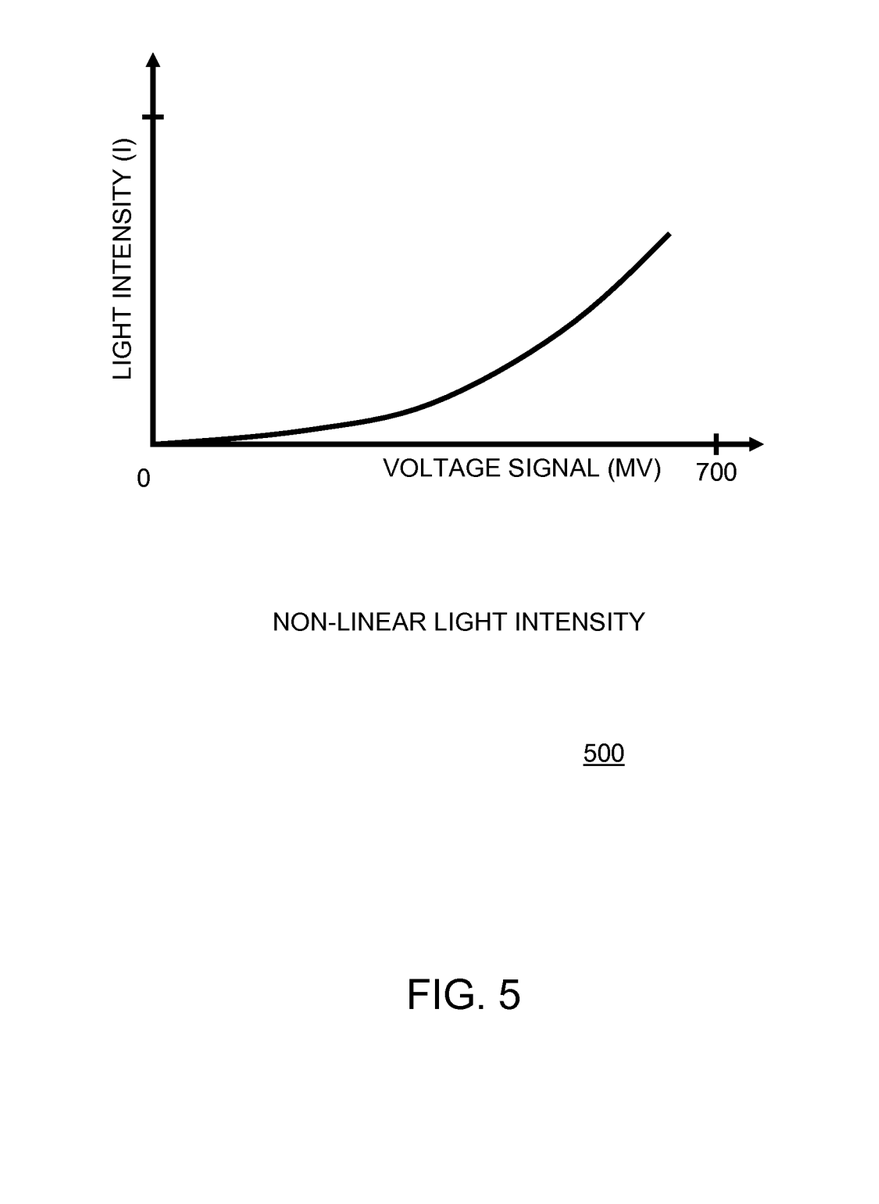
FIG. 5 illustrates a graphical relation between light intensity and voltage signal.

Further, in one illustrative example, to adjust the luminance of the display device, the display controller is capable of adjusting gamma settings of the display device. The gamma settings can be defined as the adjustment in the intensity of light generated by a physical device. The intensity (I) of light is a non-linear function of a voltage signal (V) applied to the sub-pixels for display, as illustrated in FIG. 5. For example, the intensity (I) can be given by the following equation:

$$I = V^{\frac{22}{10}} \qquad \text{Eq. (2)}$$

This non-linearity must be compensated in order to achieve correct intensity ($I_C$). This adjustment of intensity is achieved by transforming the applied signal:

$$Ic = I^{\frac{10}{22}} = V \qquad \text{Eq. (3)}$$

Therefore adjustment in the voltage signal is done to improve intensity. The gamma settings are adjusted so that the relative luminance ratio between the white color and any grey color in a RGBW display is within approximately 50 percent of the relative luminance ratio between the white color and any grey color in the RGB display before adjusting the luminance settings of the sub-pixels. A pixel is said to display a grey color when all the three primary color settings of the sub-pixels are the same and less than maximum.

FIG. 5 illustrates a graphical relation 500 showing the variation of light intensity with a changing voltage signal. The graphical relation 500 represents light intensity on the Y-axis, and voltage signal ranging from zero to 700 milli volts (mV) on the X-axis. The curve shows the non-linear nature of intensity (I) with respect to the applied voltage (V). The curve has an exponent value approximately equal to 2.2.

Various embodiments of the invention ensure better display of all display points and pixels displaying all colors. The display devices employing the above described method and system for adjusting luminance, ensure a clear picture with correct luminance in RGBW display. Further, adjusting the luminance will also allow colors to appear as expected. Moreover, adjusting output power, backlight and gamma settings also minimizes changes in the image due to adjustment in the luminance.

It is expected that one of ordinary skill, notwithstanding possibly significant effort and many design choices motivated by, for example, available time, current technology, and economic considerations, when guided by the concepts and principles disclosed herein will be readily capable of generating such software instructions and programs and ICs with minimal experimentation.

While the present disclosure and the best modes thereof have been described in a manner establishing possession and enabling those of ordinary skill to make and use the same, it will be understood and appreciated that there are equivalents to the exemplary embodiments disclosed herein and that modifications and variations may be made thereto without departing from the scope and spirit of the inventions, which are to be limited not by the exemplary embodiments but by the appended claims.

What is claimed is:

1. A method in a display device including a plurality of pixels, each pixel comprising at least two sub-pixels, the display device including red, green, blue and white sub-pixels, the method comprising:
    displaying an image having saturated color,
        saturated color is color produced by a pixel in which at least one, but not all, primary color settings is less than approximately 25 percent of its maximum value; and
    adjusting luminance settings of sub-pixels so that a relative luminance ratio between a full white color and any fully saturated color is within approximately 25 percent of a predefined reference relative luminance ratio between the full white color and the same fully saturated color in an RGB display device including only red, green and blue sub-pixels;
    fully saturated color is color produced by a pixel in which at least one, but not all, primary color setting is less than approximately 25 percent of its maximum value when all other primary color settings for the pixel are more than approximately 75 percent of their maximum value, wherein the white sub-pixel of each of the plurality of pixels having a white sub-pixel of the display device has its luminance reduced based on a determined maximum deviation, where the determined maximum deviation is based on determining for each of the plurality of pixels associated with the image a deviation that the relative luminance ratio associated with the corresponding pixel deviates from the predefined reference relative luminance ratio relative to the same fully saturated color, determining a one of the plurality of pixels associated with the image that has a largest amount of determined deviation, and selecting the largest amount of determined deviation for use as the determined maximum deviation to be used in reducing the luminance of each of the white sub-pixels.

2. The method of claim 1, adjusting the luminance settings includes adjusting luminance settings of only the white sub-pixels.

3. The method of claim 1, adjusting the luminance setting includes adjusting luminance settings of any combination of the sub-pixels.

4. The method of claim 1, adjusting an output power of the display device so that luminance of the full white color is within approximately 25 percent of luminance of the full white color before adjusting the luminance setting of the sub-pixels.

5. The method of claim 4, adjusting the output power includes adjusting a backlight brightness of the display device.

6. The method of claim 4, adjusting the output power of the display device includes adjusting an input current of an emissive display device.

7. The method of claim 1, adjusting a gamma setting of the display device so that a relative luminance ratio between a white color and any grey color is within approximately 50 percent the relative luminance ratio between the white color and the grey color before adjusting the luminance setting of the sub-pixels.

8. A display device comprising:
    a plurality of pixels, each pixel comprising at least two sub-pixels, the display device including red, green, blue and white sub-pixels;

an image on the display device, the image having saturated color, the saturated color is color produced by a pixel in which at least one, but not all, primary color settings is less than approximately 25 percent of its maximum value;

a display controller having a controller output coupled to the plurality of pixels, the display controller adjusting luminance settings of sub-pixels so that a relative luminance ratio between a full white color and any fully saturated color is within approximately 25 percent of a predefined reference relative luminance ratio between the full white color and the same fully saturated color in an RGB display device including only red, green and blue sub-pixels;

fully saturated color is color produced by a pixel in which at least one, but not all, primary color setting is less than approximately 25 percent of its maximum value when all other primary color settings for the pixel are more than approximately 75 percent of their maximum value, wherein the white sub-pixel of each of the plurality of pixels having a white sub-pixel of the display device has its luminance reduced based on a determined maximum deviation, where the determined maximum deviation is based on determining for each of the plurality of pixels associated with the image a deviation that the relative luminance ratio associated with the corresponding pixel deviates from the predefined reference relative luminance ratio relative to the same fully saturated color, determining a one of the plurality of pixels associated with the image that has a largest amount of determined deviation, and selecting the largest amount of determined deviation for use as the determined maximum deviation to be used in reducing the luminance of each of the white sub-pixels; and wherein the luminance spectrum of the red, green and blue sub-pixels of the RGB display is the same as the luminance spectrum of the red, green and blue sub pixels in the display device including white sub-pixels.

9. The display device of claim 8, the display controller adjusting luminance settings by adjusting luminance settings of only the white sub-pixels.

10. The display device of claim 8, the display controller adjusting the luminance settings by adjusting luminance settings of any combination of sub-pixels.

11. The display device of claim 8, the display controller adjusting an output power of the display device so that the luminance of the full white color is within approximately 25 percent of the luminance of the full white color before adjusting the luminance setting of the sub-pixels.

12. The display device of claim 11 includes a backlight, the display controller adjusting the output power of said device by adjusting brightness of the backlight.

13. The display device of claim 11 is an emissive display device, the display controller adjusting the output power by adjusting an input current of said emissive display device.

14. The display device of claim 8, the display controller adjusting a gamma setting of the display device so that a relative luminance ratio between the white color and any grey color is within approximately 50 percent the relative luminance ratio between the white color and the grey color before adjusting the luminance setting of the sub-pixels.

15. The method of claim 1 wherein the full white color is color produced by a pixel in which all three primary color settings are at substantially maximum values.

* * * * *